United States Patent

Deverse et al.

[15] 3,699,917

[45] Oct. 24, 1972

[54] VAPOR DEPOSITION APPARATUS

[72] Inventors: Frank T. Deverse, Wappingers Falls; John A. Kurtz, Hopewell Junction; Daniel Rendon, Fishkill; Kenneth A. Trahn, Poughkeepsie; James W. Tuttle, Wappingers Falls, all of N.Y.

[73] Assignee: Cogar Corporation, Wappingers Falls, N.Y.

[22] Filed: Oct. 2, 1970

[21] Appl. No.: 77,453

[52] U.S. Cl. ......................118/49, 118/69, 118/503, 211/41, 269/57, 269/287

[51] Int. Cl. ..............................................C23c 13/08

[58] Field of Search ..............................118/48–49.5; 117/106–107.2; 219/275

[56] References Cited

UNITED STATES PATENTS

| | | | |
|---|---|---|---|
| 1,954,950 | 4/1934 | Russell | 118/49 X |
| 2,440,135 | 4/1948 | Alexander | 118/49 X |
| 2,557,584 | 6/1951 | Wishart et al. | 118/49 |
| 2,767,682 | 10/1956 | Smith | 118/49 |
| 2,768,098 | 10/1956 | Hoppe | 118/49.1 X |
| 2,847,325 | 8/1958 | Riseman et al. | 118/48 X |
| 2,851,579 | 9/1958 | Pfeifer | 118/49 X |
| 2,885,997 | 5/1959 | Schwindt | 118/49 |
| 2,902,972 | 9/1959 | Layer et al | 118/48 |
| 2,998,376 | 8/1961 | Smith, Jr. | 118/49 X |
| 3,395,674 | 8/1968 | Burham et al. | 118/49.1 |

FOREIGN PATENTS OR APPLICATIONS

| | | | |
|---|---|---|---|
| 213,834 | 11/1957 | Australia | 118/49 |
| 70,468 | 12/1969 | Germany | 118/48 |
| 962,069 | 5/1963 | Great Britain | 118/49 |
| 1,004,739 | 9/1965 | Great Britain | 118/49.1 |
| 1,017,741 | 1/1966 | Great Britain | 118/49 |

*Primary Examiner*—Morris Kaplan
*Attorney*—Harry M. Weiss

[57] ABSTRACT

Apparatus for vapor depositing solder onto the terminal areas of semiconductive wafers includes an evacuable rectangular cabinet. A source for holding the solder and for providing heat thereto to cause evaporation thereof is cantilevered from the rear wall of the cabinet. The wafers to be coated are held within mask assemblies on a rotatable dome assembly. The dome is made up of a plurality of wire rings arranged in a plurality of wafer carrying tiers. A cooling shield surrounds the source. During operation the wafers are rotated about the source. Each wafer is exposed to evaporant approximately one-sixth of each cycle and the remaining time is cooled by radiation. Evaporant trim tabs between source and dome assure uniform distribution of solder on all wafers, regardless of tier location.

8 Claims, 5 Drawing Figures

INVENTORS
FRANK T. DEVERSE
JOHN A. KURTZ
DANIEL RENDON
KENNETH A. TRAHN
JAMES W. TUTTLE

BY Joseph L. Spiegel
Harry M. Weiss
ATTORNEYS

VAPOR DEPOSITION APPARATUS

FIELD OF THE INVENTION

The present invention relates to vapor deposition apparatus. While not so limited, the invention finds immediate application in apparatus for vapor depositing solder onto the terminal areas of semiconductive devices.

DESCRIPTION OF THE PRIOR ART

The manufacture of semiconductive devices, including both passive devices such as resistors, capacitors and diodes, and active devices such as transistors and integrated circuit devices, involves successive oxidation, etching, diffusion and metallization steps and the like. Towards the end of the processing procedure, a passivation layer, typically quartz, is formed on the structure, holes are etched in the passivation layer and successive layers of metal-forming terminal areas are deposited to make ohmic contact to underlying regions of the semiconductive substrate through conductive stripes interconnected thereto. A layer of solder is then applied to the terminal areas, which solder may be used for bonding contacts to the terminal areas or act as the contacts themselves.

In the past, solder has been evaporated in vacuum from a heated crucible onto the terminal areas of the semiconductive device through a mask. Generally speaking, the prior art techniques and apparatus are characterized by low output and small evaporant size.

SUMMARY OF THE INVENTION

An object of the invention is an improved vacuum deposition apparatus.

Another object is a high production vacuum deposition apparatus.

Still another object is such a system with a large evaporant source, which is extremely rugged and reliable.

These and other objects, features, and advantages are accomplished in accordance with the present invention, one illustrative embodiment of which includes terminal areas of semiconductive wafers including an evacuable rectangular cabinet. A source for holding the solder and for providing heat thereto to cause evaporation thereof is cantilevered from the rear wall of the cabinet. The wafers to be coated are held within mask assemblies on a rotatable dome assembly. The dome is made up of a plurality of wire rings arranged in a plurality of wafer carrying tiers. A cooling shield surrounds the source. During operation the wafers are rotated about the source. Each wafer is exposed to evaporant approximately one-sixth of each cycle and the remaining time is cooled by radiation. Evaporant trim tabs between source and dome assure uniform distribution of solder on all wafers, regardless of tier location.

DESCRIPTION OF THE DRAWING

The foregoing and other objects, features and advantages of the invention will be apparent from the following more particular description of the preferred embodiments of the invention as illustrated in the accompanying drawing, wherein.

DESCRIPTION OF THE PREFERRED EMBODIMENTS

While not so limited, the invention finds immediate application in vapor depositing solder onto the terminal areas of a semiconductive device and the ensuing discussion will center on that application.

Figure 1:
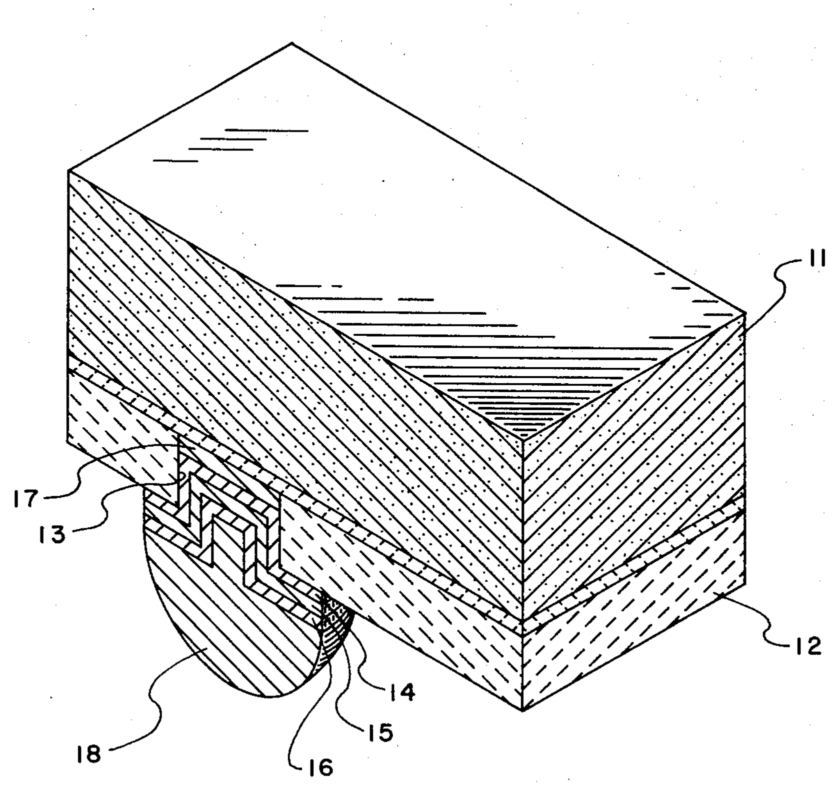
FIG. 1 shows an enlarged cross-section, partly broken away, of a semiconductive device to which metal may be applied, using the novel vapor deposition apparatus of the present invention.

Thus, referring to FIG. 1, there is shown an enlarged schematic, cross-sectional view of a substrate or wafer 11 of semiconductive material having a protective or passivating layer 12 formed thereon. Holes 13 are etched in the passivating layer and terminal areas are formed, typically successive layers of chromium 14, copper 15 and gold 16, to make ohmic contact to underlying regions of the wafer through aluminum stripes 17 interconnected thereto.

Solder 18 is then deposited on these terminal areas, using the novel vapor deposition apparatus of the present invention. The solder will be used for bonding contacts to the terminal areas or act as the contacts themselves. When used as contacts, the solder film deposited is 0.002 inches high, but when the wafer subsequently is fluxed and run through a furnace at 345° C, the solder reflows with its base conforming to the underlying smaller diameter of the Cr–Cu–Au terminal. The final dimensions of the contact is approximately 0.005 inches in diameter and 0.004 inches high.

Figure 2:
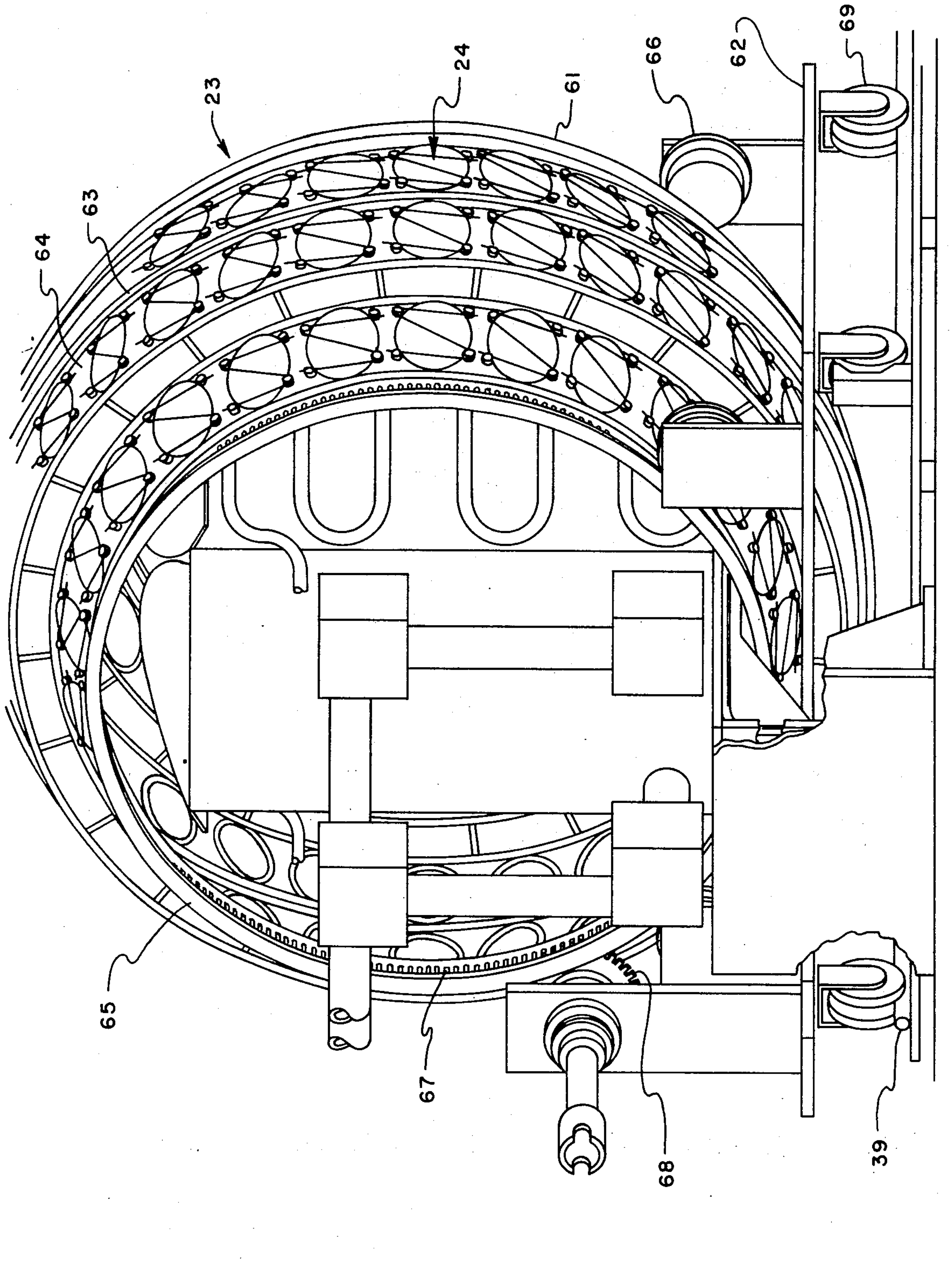
FIG. 2 is a perspective view, partly broken away, of the novel vapor deposition apparatus of the present invention, illustrating, in particular, the dome assembly.
Figure 3:
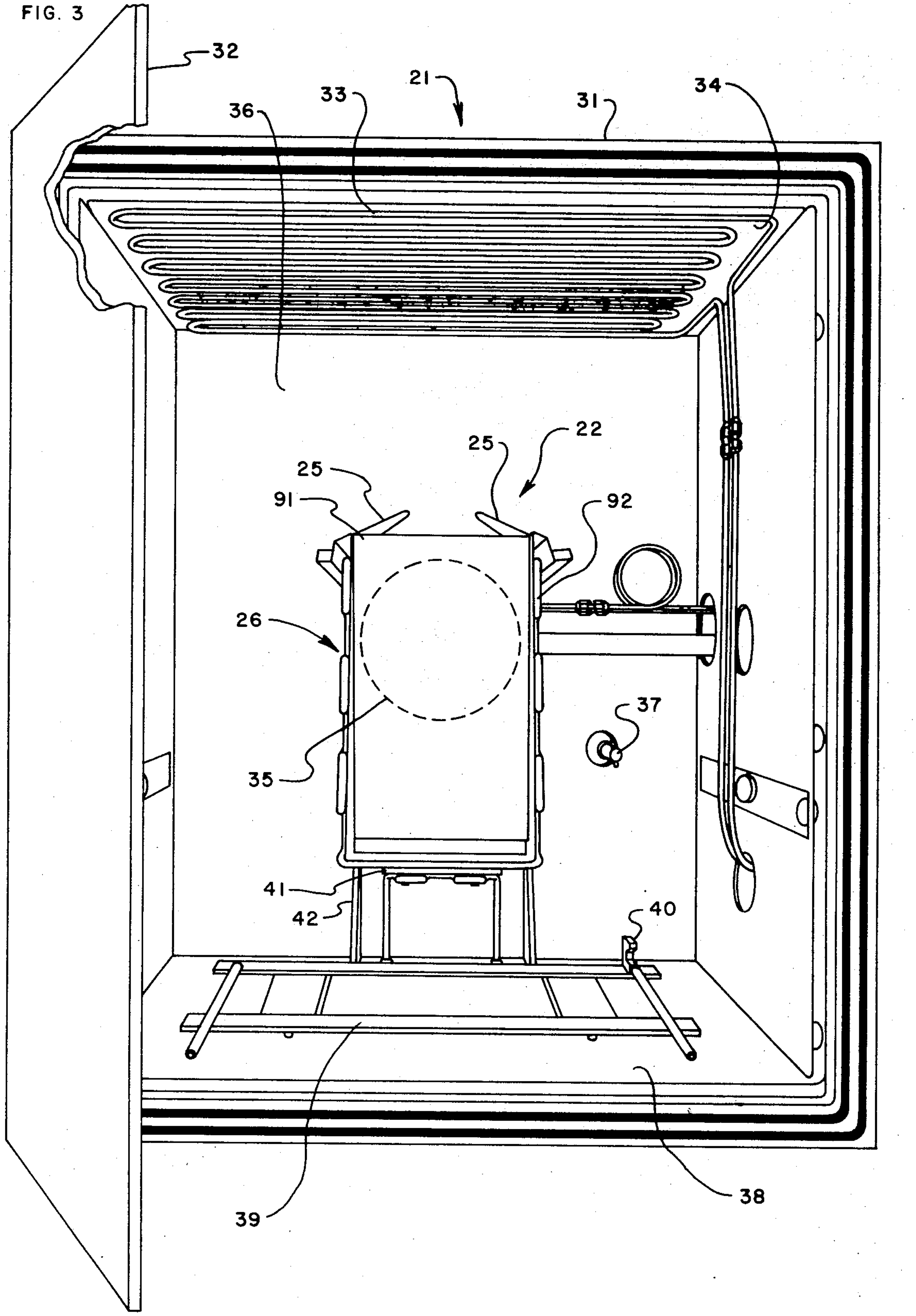
FIG. 3 is a front view of the evacuation chamber.

Referring now to FIGS. 2 and 3, the vapor deposition apparatus of the present invention is shown as including: an evacuable deposition chamber 21; an evaporation means or source 22 for holding a vaporizable metal, solder, and for providing heat thereto to cause the evaporation of the metal into a segment of the chamber; rotatable wafer holding means or dome assemblies; means 24 for mounting wafers on the dome and for exposing the terminal areas of the devices of the wafer to the evaporant; evaportant trim tabs 25 between source and dome to assure even distribution of solder onto all wafers; and, means 26, disposed between the source and dome for cooling the wafers by radiation when not exposed to evaporant.

EVACUABLE DEPOSITION CHAMBER

As best seen in FIG. 3, the evacuable deposition chamber 21 comprises a stainless steel, rectangular shaped cabinet 31, typically 42 inches high, 36 inches wide, and 36 inches deep, with a front, vertically pivoting door 32. In the past, bell jar systems have been almost exclusively used for this type of apparatus. The absence of a bell jar has eliminated the trouble-prone hoist and assures that all internal tooling will be aligned whether vented or under vacuum. The pivoting door 32, in open position, permits one to insert and remove the dome assemblies and provides easy access to the source 22, and when in closed position, seals the cabinet 31 to permit its evacuation to a very low pressure.

Coils 33, through which a cooling liquid, typically water from an external source, is circulated, are brazed to the top wall 34 of the cabinet. During evaporation, some evaporant comes in contact with the top wall 34. By cooling the top wall, the evaporant deposited thereon solidifies, thus eliminating possible spatter onto the wafers by solder dripping off the top wall.

The chamber is pumped through an opening 35 in the rear wall 36 of the cabinet. The system (not shown) for evacuating the chamber typically includes a liquid nitrogen trap, a mechanical pump such as a Kinney KT150 and a diffusion pump such as a Norton 10 inch VHS. By pumping through the rear wall, the source cannot mask or obscure the pumping inlet, thus assuring that full pumping speed is always available. A vacuum gauge (not shown) for measuring pressure within the chamber, is in communication with the chamber through an opening on the left side of the rear wall 36. A mechanical feedthrough 37 extends through an opening on the right side of the rear wall and is adapted to engage a gear on the dome assembly 23 (to be described hereafter) for driving same when the dome is in position and the chamber is evacuated.

The bottom wall 38 is provided with a track assembly 39 on which the dome assembly 23 rests when in use. The dome assembly is locked in place after abutment of its cradle with a stop 40 at the rear of the track assembly.

Valve and gauge controllers (not shown), are mounted directly beneath the cabinet. All other instrumentation is in specially built enclosures.

SOURCE

An evaporation means or source 22 is provided for holding the vaporizable metal, typically 95 Pb, 5 Sn solder, and for providing heat thereto to cause evaporation. The source is supported on an arm 41 cantilevered from a mounting plate 42 at the rear of cabinet 31.

Figure 4:
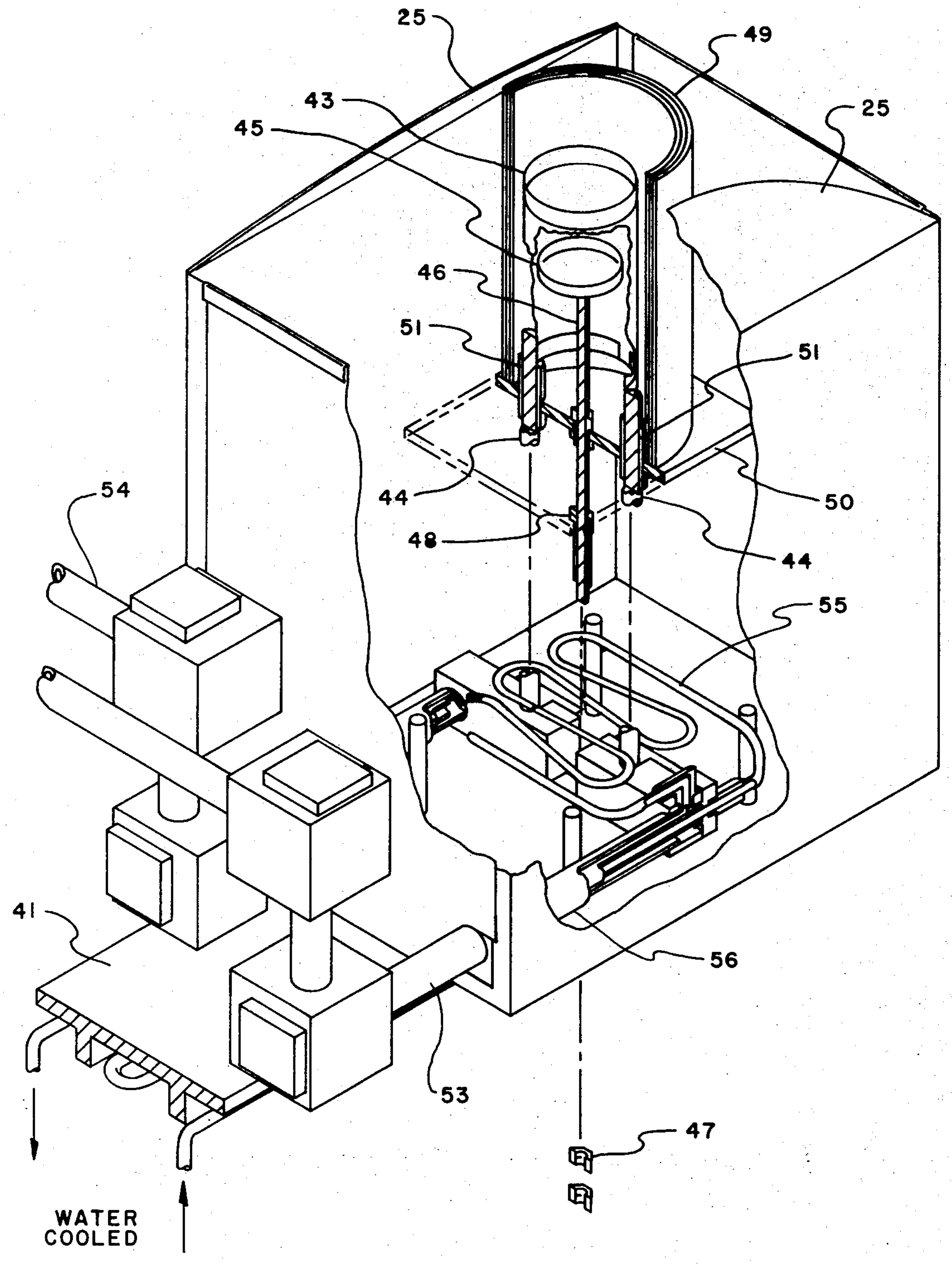
FIG. 4 is an enlarged perspective view, partly broken away, of the novel evaporation source and trim tabs; and, FIG. 5 is an enlarged, exploded view of the mask assembly used in the present invention.

As best seen in FIGS. 3 and 4, the source includes a heating element 43 comprising a plurality of spaced, elongated foraminous plexuses of tungsten. The plexuses are typically 6 inches high and arranged in a circle of 3 inch diameter. Current is fed to the element by means of a plurality of rods 44. The Joule heat thus generated is radiated to a solder receiving crucible, (not shown) typically 2½ inches in diameter and 3 inches high which is mounted on a pedestal 45 extending from a threaded rod 46. The height of the pedestal 45 can be varied by adjusting the relative position of the rod 46 with respect to the support arm 41 cantilevered from the mounting plate 42, by repositioning of nuts 47 and collar 48 on the rod 46.

Radiation shields are provided surrounding at 49 and beneath at 50 the heating element. Those at 49 which surround rest against a bottom heat shield plate 50. Plate 50 is electrically isolated from the current-carrying rods 44 by ceramic sleeves 51.

Current is brought into the rods 44 via internally water cooled bus bars 53,54. In the case of at least one of the bars 53 water is forced through a first conduit 55 into the space beneath and against the heat shield plate 50 and returned through an annular space surrounding the first conduit 55 defined by a second coaxial conduit 56. The use of the radiation shields 49,50 and water cooling of the bus bars 53,54 minimizes the heat radiated downward.

DOME ASSEMBLY

Referring to FIG. 2, a wafer holding means or dome assembly 23, including a dome 61 and cradle 62 is provided, for holding a plurality of wafers and for rotating same about the source 22.

The dome 61 is fabricated by joining together, as by welding/brazing, large stainless steel wire rings 63. The rings are arranged in five wafer carrying tiers, 64, and with two sturdy loops 65 at each end which rest on free turning wheels 66. Rotation is accomplished through rods 67 which mesh with a driven gear 68 on the cradle 62.

Means 24 are provided for mounting the wafers on the dome in such a manner that they are a predetermined distance from the source and directly face the source when exposed to evaporant.

Figure 5:
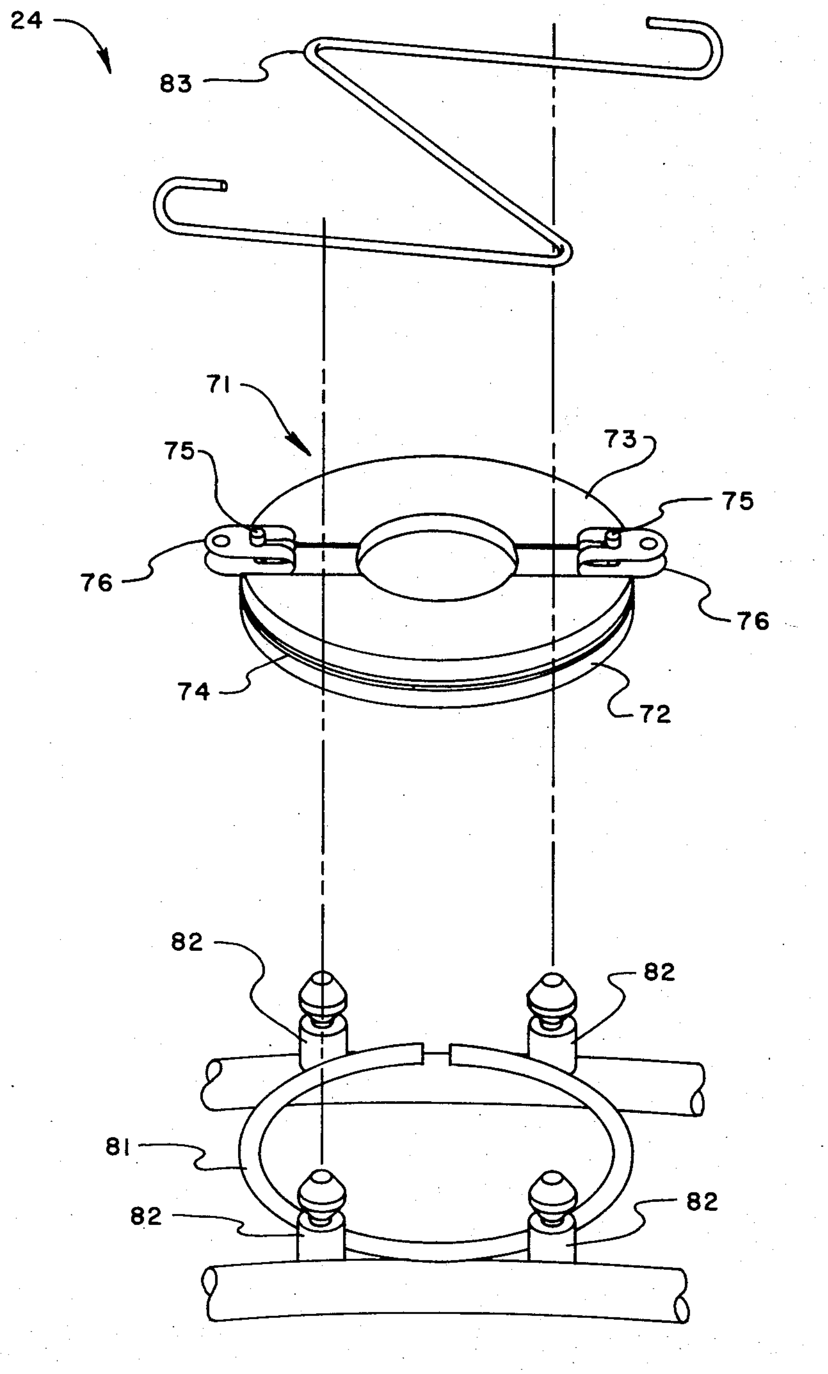

As best seen in FIG. 5, each wafer is held within a wafer mask assembly 71 which includes a front 72 and rear 73 plate and a mask 74 which exposes only the terminal areas of the wafers. A pair of orienting pins 75 extend from the front plate 72 through the mask 74 and rear plate 73, and clips 76 snap on these pins to hold plates, 72,73, mask 74 and wafer firmly together.

Each tier includes a plurality of smaller wire rings 81 welded thereto. There are 142 such smaller rings. Slotted pins 82 are spaced about these smaller rings 81 at 80° and 100° intervals.

The wafer mask assemblies 71 are mounted against the rings 81 and held in place by a stainless steel Z-shaped clip 83 which loops about the slots of two of the pins and presses against the slots of the other two pins.

Cradle 62 is slidably supported on track assembly 39 by means of free turning wheels 69. When not in use, the dome assembly 23 can be quickly removed from the cabinet 31 and placed on a dolly with matching tracks.

COOLING MEANS

As shown in FIGS. 3 and 4, a U-shaped stainless steel shield 91 which is supported on the support arm 41, surrounds the sides and bottom of the source 22. Tubing 92, through which a cooling fluid such as water is circulated, is brazed to the outer walls of the shield. Thus, the wafers, when not being exposed to evaporant, are being cooled. In this way, solder which has previously been deposited on terminal areas will not melt back or away from the terminal areas. The heat of fusion and vaporization can be dissipated without heating the mask assemblies and wafers above the evaporant melting point provided the evaporation rate is not too high. Otherwise, the mask may not separate from the wafer without pulling some of the evaporant material with it.

EVAPORANT TRIM TABS

The solder evaporated from the crucible is to be deposited on the wafers carried by the dome. However, the leadrtin evaporation at the high rates employed suffers from beaming which in turn is a function of evaporation rate so that wafers on different tiers receive varying amounts of solder in equal time periods. To assure uniform distribution of solder on all wafers, trim tabs 25 extending from the top edges of the cooling shield 91 are positioned in line of sight between the source of evaporant within the crucible and the dome. The tabs are generally parabolic in shape, their precise shape being determined emperically. The evaporant distribution is first determined experimentally and then the tabs are individually tailored.

OPERATION

In operation, the wafers whose terminal areas are to be coated are placed within the mask assemblies 71 and fixedly secured against the small rings 81 of the dome 61.

The dome assembly 23 is next placed within the vacuum chamber 21, the cradle 62 is locked in place with its gear 68 coupled to the mechanical feedthrough 37.

The door 32 of the cabinet is closed and the chamber evacuated to a pressure on the order of $3 \times 10^{-5}$ torr.

Current, typically 1,000 amperes, is then fed to the heating element 44 which, in turn, by radiation, heats the solder within the crucible of the source 22. The dome 61 is set to rotate typically at a speed of five revolutions per minute.

With the dome rotating, the solder begins to vaporize putting a fine coating over the masks 74 and on the terminal areas of the wafers during the time that the wafers are above the crucible. During exposure, each wafer faces the source. If not, the mask 74, whose thickness is almost as great as the hole diameter, would shield the wafer from some or all of the evaporant.

The evaporant trim tabs 25 assure that each wafer, regardless of tier location, is coated uniformly.

Each wafer is exposed to the evaporant for only one sixth of each cycle. The remaining time the wafers are cooled. The cooling prevents meltback and assures that the solder deposited on the terminal areas do not separate from the wafer when removed from the mask assembly.

The cycle continues for a period of 90 minutes until the wafer terminal areas have been coated to a predetermined desired thickness whereupon the current is turned off. Subsequently, the rotation of the dome 61 is stopped, the cabinet 31 is opened and the dome assembly 23 removed from the vacuum chamber 21 thereby completing the coating operation.

Among the advantages of the apparatus are that a large number of wafers can be coated and a large quantity of solder can be deposited in a relatively short period of time. Moreover, the cooling means avoids the possibility of melt-back thus assuring that each terminal area is uniformly coated with solder and no solder finds its way onto portions of wafers which were masked during the deposition operation.

While the invention has been particularly described and shown with reference to the preferred embodiments thereof it will be understood by those skilled in the art that various changes in form and detail and omissions may be made therein without departing from the spirit and scope of the invention.

What is claimed is:

1. Apparatus for vapor depositing metal onto predetermined small areas of wafers comprising:

an evacuable deposition chamber;

source means disposed within said chamber for holding a vaporizable metal and for providing heat thereto to cause the evaporation thereof into a segment of said chamber;

means comprising pairs of ring elements forming generally a spherical segment rotatable about a horizontal axis and said source means for holding a plurality of wafers and for successively exposing said wafers to said evaporant in the evaporation segment of said chamber;

a plurality of wafer support means on each pair of ring elements for mounting said wafers on said rotatable holding means, including masking means for exposing said predetermined small areas of said wafer to said evaporant;

each of said support means comprising an annular element transverse to and fixed to a pair of said ring elements, a plurality of notched posts fixed to said ring elements and operatively associated with said annular element, and a spring member adapted to overlie said annular element and to be retained within said notches whereby an assemblage of a wafer and said mask means may be fixed relative to said rotatable holding means; and shield means substantially surrounding said source and including cooling means for periodically cooling said wafers.

2. The invention defined by claim 1 wherein said chamber is a rectangular cabinet and said source is cantilevered from a wall of said cabinet.

3. The invention defined by claim 2 including means for cooling the top wall of said cabinet.

4. The invention defined by claim 3 including means connected through a wall of said cabinet for evacuating said chamber.

5. The apparatus of claim 1 wherein said shield comprises an open topped member surrounding the sides and bottom of said source.

6. The apparatus of claim 1 wherein said cooling means comprises coil means comprises coil means disposed at the exterior of said shield.

7. The apparatus of claim 5 wherein said shield includes configured tab means fixed to, and overlying in part, said open top of the shield whereby said tabs modify the vapor stream to effect uniform deposition on said wafers.

8. Apparatus for vapor depositing solder onto the terminal areas of semiconductive wafers comprising:

an evacuable cabinet having a top, side and rear wall and floor, and a front door providing access to the interior of said cabinet and sealing same in closed position;

means for cooling the top wall of said cabinet;

means connected through the rear wall of said cabinet for evacuating said cabinet;

an evaporation source cantilevered from the rear wall of said cabinet, for holding solder and for providing heat thereto to cause evaporation thereof toward the top wall of said cabinet;

a spherical segment means disposed on a horizontal axis and rotatable about said source for holding a plurality of wafers and for successively exposing said wafers to said solder;

said segment means being configured from a plurality of large rings into a plurality of tiers;

each said tier including a plurality of small rings;

means for mounting said wafers on said segment means at said small ring locations, including masking means for exposing the terminal areas of said wafer to said solder;

a cooling structure spaced between said segment means and source for cooling said wafers when not exposed to solder; and;

evaporant trim tabs extending from said cooling structure in line of sight between said source and segment means and configured to effect a uniform deposition on said wafers.

* * * * *